(12) United States Patent
Staley et al.

(10) Patent No.: US 10,084,197 B2
(45) Date of Patent: Sep. 25, 2018

(54) SYSTEM AND METHOD OF GENERATING ELECTRICITY FROM THE SALINIZATION OF FRESHWATER

(71) Applicant: THE GENERAL HOSPITAL CORPORATION, Boston, MA (US)

(72) Inventors: Kevin Staley, Charlestown, MA (US); Kyle Lillis, Boston, MA (US)

(73) Assignee: The General Hospital Corporation, Boston, MA (US)

( * ) Notice: Subject to any disclaimer, the term of this patent is extended or adjusted under 35 U.S.C. 154(b) by 393 days.

(21) Appl. No.: 14/760,036

(22) PCT Filed: Jan. 10, 2014

(86) PCT No.: PCT/US2014/011026
§ 371 (c)(1),
(2) Date: Jul. 9, 2015

(87) PCT Pub. No.: WO2014/110358
PCT Pub. Date: Jul. 17, 2014

(65) Prior Publication Data
US 2015/0364783 A1    Dec. 17, 2015

Related U.S. Application Data

(60) Provisional application No. 61/751,354, filed on Jan. 11, 2013.

(51) Int. Cl.
*H01M 8/16* (2006.01)
*H01M 8/00* (2016.01)
(Continued)

(52) U.S. Cl.
CPC ............ *H01M 8/16* (2013.01); *H01G 9/2059* (2013.01); *H01M 4/9041* (2013.01); *H01L 51/0093* (2013.01); *Y02E 10/542* (2013.01)

(58) Field of Classification Search
CPC ....... H01M 8/16; H01M 4/9041; C25B 13/08; C25B 5/00
See application file for complete search history.

(56) References Cited

U.S. PATENT DOCUMENTS

| | | | | |
|---|---|---|---|---|
| 2003/0104375 A1* | 6/2003 | Delong | ................ | C07K 14/195 435/6.14 |
| 2008/0102626 A1* | 5/2008 | Ryu | .................. | H01L 21/32125 438/643 |
| 2011/0171496 A1* | 7/2011 | Noguera | ................ | B82Y 10/00 429/2 |

FOREIGN PATENT DOCUMENTS

WO      2011/050473 A1     5/2011

OTHER PUBLICATIONS

"Salty Solution for Energy Generation", Phil McKenna, MIT Technology Review, p. 1-3, May 3, 2011. Downloaded from https://www.technologyreview.com/s/423903/salty-solution-for-energy-generation/.*

(Continued)

*Primary Examiner* — Kenneth J Douyette
(74) *Attorney, Agent, or Firm* — David S. Resnick; David F. Crosby; Nixon Peabody LLP (57) ABSTRACT

A system and method of generating electricity from the salinization of freshwater is provided. In one embodiment, the diffusion of cations and anions from saline to freshwater is rapidly alternated in order to generate electrical power in the form of alternating current. To create pathways for the rapidly alternating diffusion of cations and anions, rhodopsins (light-activated ion channels and pumps) are expressed in bacteria that are growing as a biofilm on a membrane that separates the saline and freshwater. Illumination of the biofilm with blue light permits cation diffusion through (Continued)

cation-permeable channelrhodopsins. Illumination of the biofilm with yellow light permits diffusion of anions through halorhodopsins.

22 Claims, 6 Drawing Sheets

(51) Int. Cl.
*H01M 4/90* (2006.01)
*H01G 9/20* (2006.01)
*H01L 51/00* (2006.01)

(56) References Cited

OTHER PUBLICATIONS

Han et al., PLoS ONE, 3:e299 (2007). "Multiple-Color Optical Activation, Silencing, and Desynchronoization of Neural Activity, with Single-Spike Temporal Resolution."
Khimicheskaya entsiklopediya. Tom 5. Moskva, Nauchnoe izdatelstvo "Bolshaya Rossyskaya Entsiklopediya", 1998, v. 5, col. 843.
Nagel et al., PNPAS, 100(24):13940-13945 (2003). "Channelrhodopsin-2, a directly light-gated cation-selective membrane channel."
Ullmann's Encyclopedia of Industrial Chemistry, 2005. Wiley-VCH Verlag GmbH & Co. KGaA, WeinHeim, Lamps, 2.3 Radiation from Semiconductors (LEDS).

\* cited by examiner

SYSTEM AND METHOD OF GENERATING ELECTRICITY FROM THE SALINIZATION OF FRESHWATER

CROSS-REFERENCE TO RELATED APPLICATION

This application claims benefit under 35 U.S.C. § 119(e) of U.S. Provisional Application No. 61/751,354 filed Jan. 11, 2013, the contents of which are incorporated herein by reference in its entirety.

FIELD OF THE INVENTION

Embodiments of the claimed invention relate to electricity generation, and in particular, to systems and methods of generating electricity from the salinization of fresh water.

BACKGROUND OF THE INVENTION

When a volume of saline is diluted with an equal volume of freshwater, the entropy of the system is increased. This increase in entropy can be considered to arise from the more random location of the salt ions: initially constricted to the volume of saline, the ions can be located in twice as many locations after dilution with an equal volume of freshwater. This increase in entropy can be harnessed to do work. Vast amounts of freshwater and wastewater mix with saline as they flow into the ocean. The energy released by this mixing represents a large, renewable, green, and available power source.

For example, complete mixing of freshwater with brine whose salinity equals ocean water (~800 mM) provides free energy of 2.5 kJ/l or 0.82 Wh/kg. The energy released by this mixing represents a power source that could be expanded globally to capture the 2 TW generated by the flux of fresh river and wastewaters into the ocean.

The key challenge to exploiting the mixing of freshwater and ocean water is the low energy density: 4 watt-hours per gallon of freshwater (about 0.01% of the energy in a gallon of gasoline). However, the volume of available freshwater and wastewater is so enormous that the power available from mixing freshwater and ocean water represents a sizeable fraction of the U.S. energy production, about as large as current nuclear power. Thus, the technical challenge is to extract this energy with sufficient efficiency to make this vast power source economically viable.

Generating electrical power by selective diffusion of ions from saline to freshwater is termed reverse or inverse electrodialysis. Current state-of-the-art techniques entail the separation of the saline and freshwater by membranes that are selectively permeable to cations or anions. The separate diffusion of cations and anions from saline into separate compartments of freshwater separates charge, creating electrical potential and the capacity to do work. Reverse electrodialysis is feasible, but the extraction efficiency is low, only about 40 mW per square meter of membrane.

Currently deployed technologies for reverse electrodialysis involve membranes that are selectively permeable to cations and anions. Although power plants using this technology are being built overseas, several factors limit the rate of power generation and thus the economic viability: high freshwater impedance, polarization, electrode consumption, membrane cost and biofouling, and DC current. These problems have prevented the large-scale utilization of reverse electrodialysis to generate electrical power.

High freshwater impedance. Ions that diffuse across the semipermeable membrane into freshwater must then diffuse across the freshwater to the electrode. The high impedance of freshwater substantially reduces the maximum current density. DC reverse electrodialysis maintains high impedance of the freshwater at the anode (Cl permeable membrane side) because this water does not become salinated (Cl$^-$ diffusing through the membrane is deposited on the anode).

Polarization. Power production in reverse electrodialysis is driven by ionic diffusion, and this can be rapidly diminished by resistive and concentration overpotentials at the electrodes and membrane caused by local imbalances of the ionic charge carriers. A critical issue for salination technology is that because the driving forces are so small, even very modest charge accumulations reduce rates of ion diffusion and power generation by over an order of magnitude without stirring, but stirring requires too much power. Technologies that have been proposed to circumvent the high impedance of freshwater remain limited by polarization and consequent overpotentials so that the power density of these devices is still only 0.1 W/m$^2$, which is not economically viable.

Electrode consumption. Using Ag/AgCl$_2$ electrodes as an example, DC ionic currents gradually deposit excess Cl on the anode and deplete the cathode of Cl. Cl is depleted from the cathode (in the sodium-accepting freshwater pool) as Cl goes into solution (2e$^-$+AgCl$_2$→Ag+2Cl$^-$), and Cl is deposited on the anode (the Cl-accepting freshwater: Ag+2Cl$^-$→AgCl$_2$+2e$^-$). This limits electrode life and necessitates moving electrodes or saline/freshwater solutions so that chloride shifts can be periodically reversed. More complex electrodes are being studied but these issues remain barriers to the feasibility of DC reverse electrodialysis. Current solutions to this problem involve toxic electrode half-reactions, electrode rinse solutions that partially short-circuit the battery, or both.

Membrane cost and biofouling. Current costs of semipermeable membranes are $100/m$^2$, and this must be lowered by a factor of 30 before reverse electrodialysis can be an economically viable means of power production. Semipermeable membranes used for industrial purposes are prone to fouling by bacterial biofilms that reduce the rate of ion diffusion. The current rate of degradation of power production due to biofouling is 70% every 6 months at the WETSUS reverse electrodialysis pilot power plant. The maintenance costs of these membranes are currently an important limitation to economic feasibility of useful power generation from reverse electrodialysis.

DC current. Current reverse electrodialysis technologies produce DC current that must be converted to AC with attendant losses.

SUMMARY OF THE INVENTION

Thus, there is a need in the art for a system allowing for the large-scale utilization of reverse electrodialysis to generate electrical power. There is further a need in the art for such a system that has high extraction efficiency, limited polarization near the membrane and electrode surfaces, and membranes that are not prone to fouling. Embodiments of the invention meet these needs and others by providing a system and method of generating electricity from the salinization of freshwater. Membranes used in the described embodiments are bacterial biofilms that permit the passage of alternating rather than direct ionic current. The bacteria are genetically engineered to express opsin proteins that are switchably permeable to either cations or anions, depending on the color of incident light.

According to one embodiment of the claimed invention, a system for generating electricity from the salinization of freshwater is provided. The system comprises a first electrode in saline, a second electrode in freshwater, a membrane separating the saline and the freshwater, the membrane comprising a biofilm, and a light source configured to illuminate the biofilm with alternating yellow and blue light. The biofilm can include confluent bacteria capable of expressing rhodopsins, and in particular, channelrhodopsins, halorhodopsins, as well as voltage- and ion-gated channels such as ClC-2. As used herein, "confluent" or "confluency" refers to the density of bacteria in the biofilm such that ion diffusion from saline to freshwater occurs primarily through the membranes of the bacteria comprising the biofilm, as opposed to diffusion through spaces between bacterial membranes.

According to another embodiment of the claimed invention, a method of generating electricity from the salinization of freshwater is provided. The method comprises separating saline and freshwater with a membrane, the membrane comprising a biofilm, placing a first electrode in the saline and a second electrode in the freshwater, and alternately illuminating the biofilm with yellow and blue light. The biofilm comprises confluent bacteria capable of expressing rhodopsins, and in particular, channelrhodopsins, halorhodopsins, and ClC-2.

Opsins are light-sensitive proteins. Prokaryotic opsins are bacterial proteins that comprise light-gated ion channels: channelrhodopsin-2 gates cationic transmembrane current in response to blue light, and halorhodopsin translocates anions across the bacterial membrane in response to yellow light. ClC-2s are voltage-gated chloride channels. These pumps and channels can be expressed in the cytoplasmic membrane of microorganisms, such as *E. coli* bacteria or archaebacteria. The bacteria are maintained as a confluent biofilm that separates saline and freshwater. The biofilm is supported by a standard membrane permitting ion flux between saline and freshwater.

Biofilms are confluent colonies of microorganisms that create well-known phenomena such as dental plaque and shower slime. Biofilms have been used industrially since the development of sand filters for water purification in the 1860s, and are widely employed in wastewater treatment. Biofilms are being increasingly adapted for a variety of industrial tasks including detoxification and catalysis. Biofouling is minimized even in wastewater environments because the membrane itself is comprised of a bacterial biofilm that has evolved many natural defenses against other organisms.

Selective cation flux from saline to freshwater occurs when the channelrhodopsins are activated by blue light. Selective anion flux from saline to the bacterial cytoplasm occurs when the halorhodopsins are activated by yellow light. Expression of rectifying chloride channels such as ClC-2 channels complete the chloride flux from bacterial cytoplasm to freshwater. Alternatively, halorhodopsin mutants that form light-gated Cl channels rather than light-driven Cl pumps can be used in place of the combination of halorhodopsins and ClC-2s, or voltage- and calcium-sensitive chloride channels could be used to either amplify the chloride conductance initiated by halorhodopsin. Alternatively, these chloride conductances could be activated by membrane voltage changes after termination of the cationic flux. In this case, synchronization of chloride conductances between individual bacteria would depend on the duration of cationic conductance; alternatively, another type of hyperpolarizing rhodopsin such as the archaerhodopsins Arch or ArchT could be used to synchronize the start of the anionic conductance.

Endogenous bacterial cation and chloride conductances can be suppressed in order to avoid short-circuiting the light-gated conductances. Thus when the channelrhodopsin is activated by light, admitting Na ions from saline to fresh water, then suppression of bacterial conductances such as ClC would increase the net cation flow from saline to fresh water. Similarly, blocking endogenous bacterial Na conductances during light-gated chloride flux would increase the net anion flux from saline to fresh water. Endogenous bacterial conductances could be blocked by suppressing the expression of proteins coded by the relevant genes. For example suppressing the expression of NavAb, the gene encoding the bacterial voltage-gated sodium conductance or ompC and ompF, genes coding for cation selective outer membrane pores, would increase net light-gated anion flux. Suppressing cicA and cicB gene expression, for example, would increase the net light-gated cation conductance.

In order to alternately gate the flow of either cations or anions from saline to freshwater, the rhodopsins are illuminated with the appropriate color of light (yellow or blue). Thus, repeating a sequence of blue and yellow illumination generates an alternating anionic and cationic current from the saline to the freshwater. Freshwater can flow through the system on its own, e.g., by wastewater pumping or river flow. The saline can be changed periodically, e.g., by gravity feed, based on the reduced density of the desalinated seawater from which ions have been dialyzed into freshwater.

The ion flux from saline to freshwater can be rapidly reversed by changing the color of illuminating light, so there is never a significant polarization (i.e., charge accumulation at the interface between freshwater and saline) that would otherwise limit the further diffusion of ions from saline to freshwater, thereby limiting the production of electricity. Further, there are no DC currents through the freshwater, so the system impedance is minimized and the rate of electricity production is maximized. In other words, ions move back and forth between the surfaces of the membrane or electrode and the water immediately adjacent to them. Because the current alternates direction, there is no need for ions to traverse the freshwater between membrane to electrode; this reduces impedance and increases the power density of the generating system. In addition, rhodopsins can provide very high levels of ion conductivity.

These improvements in impedance and membrane conductivity result in at least 100 times higher power density (e.g., from 40 mW/m$^2$ to 5 W/m$^2$), which brings the described system into the range of economic viability. In addition, the membrane is cheaper to create than inorganic membranes because it is made of grown bacteria on a simple membrane scaffold, and there is no membrane fouling because the described system is based on an established bacterial biofilm. *E. coli* are in many ways ideal organisms to create the biofilm: *E. coli* do not express electroneutral cation/Cl transporters, can thrive on nutrients in wastewater, tolerate exposure to seawater and freshwater, and readily express synthetic proteins. Archaebacteria can alternatively or additionally be used, for example, in applications where dissolved organic nutrients are in low concentration. Because archaebacteria are photosynthetic, the light that is used to gate the ion flux will also feed the bacteria.

Still other aspects, features and advantages of the present invention are readily apparent from the following detailed description, simply by illustrating a number of exemplary embodiments and implementations, including the best mode contemplated for carrying out the present invention. The present invention also is capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Systems and methods of generating electricity from the salinization of fresh water are described. In the following description, for purposes of explanation, numerous specific details are set forth in order to provide a thorough understanding of the exemplary embodiments. It is apparent to one skilled in the art, however, that the present invention can be practiced without these specific details or with an equivalent arrangement.

Figure 1:
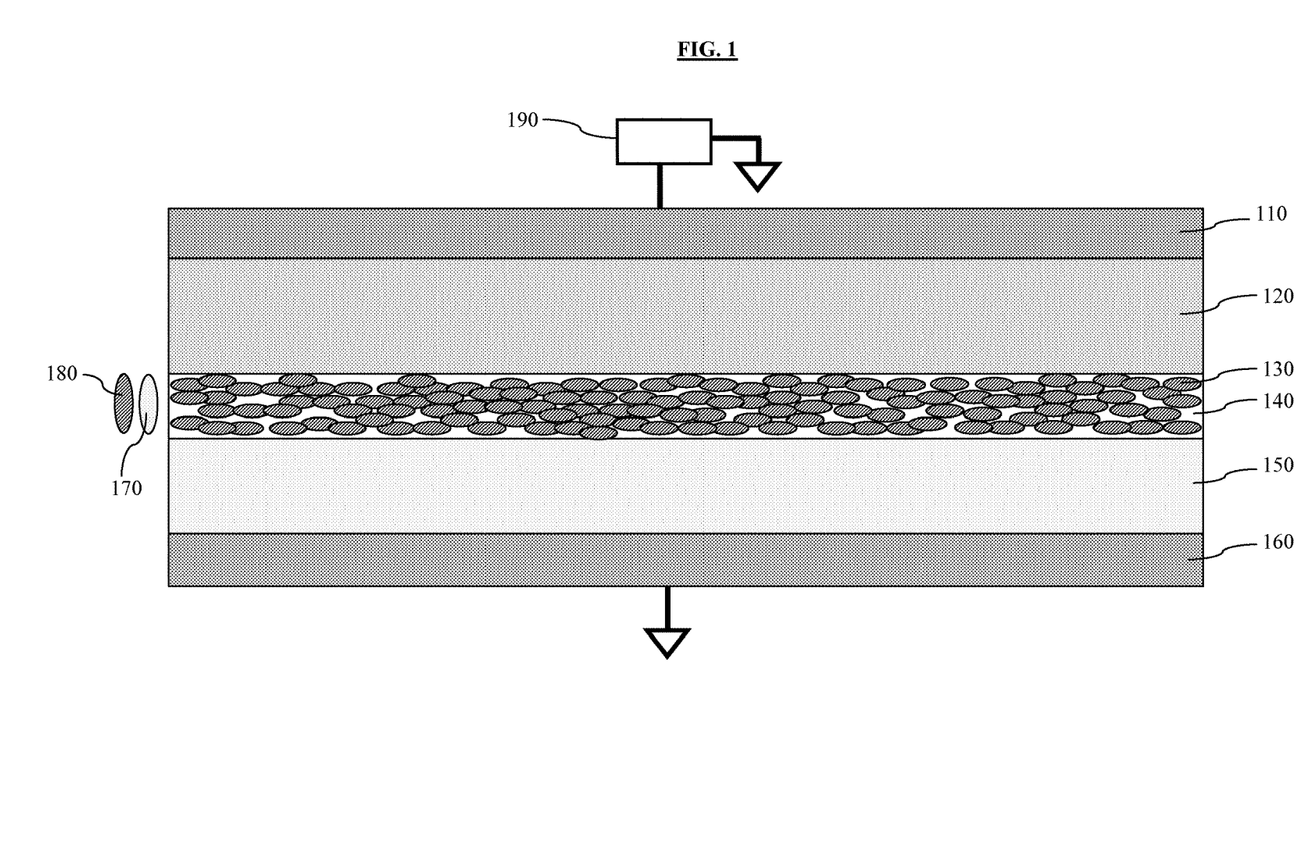
FIG. 1 is a schematic of a system for generating electricity from the salinization of freshwater according to an embodiment of the invention.

Referring now to the drawings, wherein like reference numerals designate identical or corresponding parts throughout the several views, FIG. 1 is a schematic of a system for generating electricity from the salinization of freshwater according to an embodiment of the invention. The system comprises a first electrode 110 in saline 120, and a second electrode 160 in freshwater 150. Saline 120 can be, for example, seawater or geothermal brine, while freshwater 150 can be, for example, river water, wastewater or condensed steam. Electrodes 110 and 160 can be made of any suitable material, such as Ag/AgCl or Ru/Ir.

Saline 120 is separated from freshwater 150 by a membrane 140, which comprises a biofilm of confluent bacteria 130. Membrane 140 can be any type of ion permeable membrane that permits ion flux between saline 120 and freshwater 150. Confluence of bacteria 130 allows for ion flux through, rather than between, bacteria 130. Bacteria 130 can be any type of cells or microorganisms capable of expressing rhodopsins, and in particular, channelrhodopsins, halorhodopsins and ClC-2 channels. Channelrhodopsins are light-gated cation channels, halorhodopsins are light-gated chloride pumps, and ClC-2s are voltage-gated chloride channels. These pumps and channels can be expressed in the cytoplasmic membrane of bacteria 130, such as *Escherichia coli* (*E. coli*) bacteria or archaebacteria (which natively express opsins as a means of orientation to light).

Figure 2:
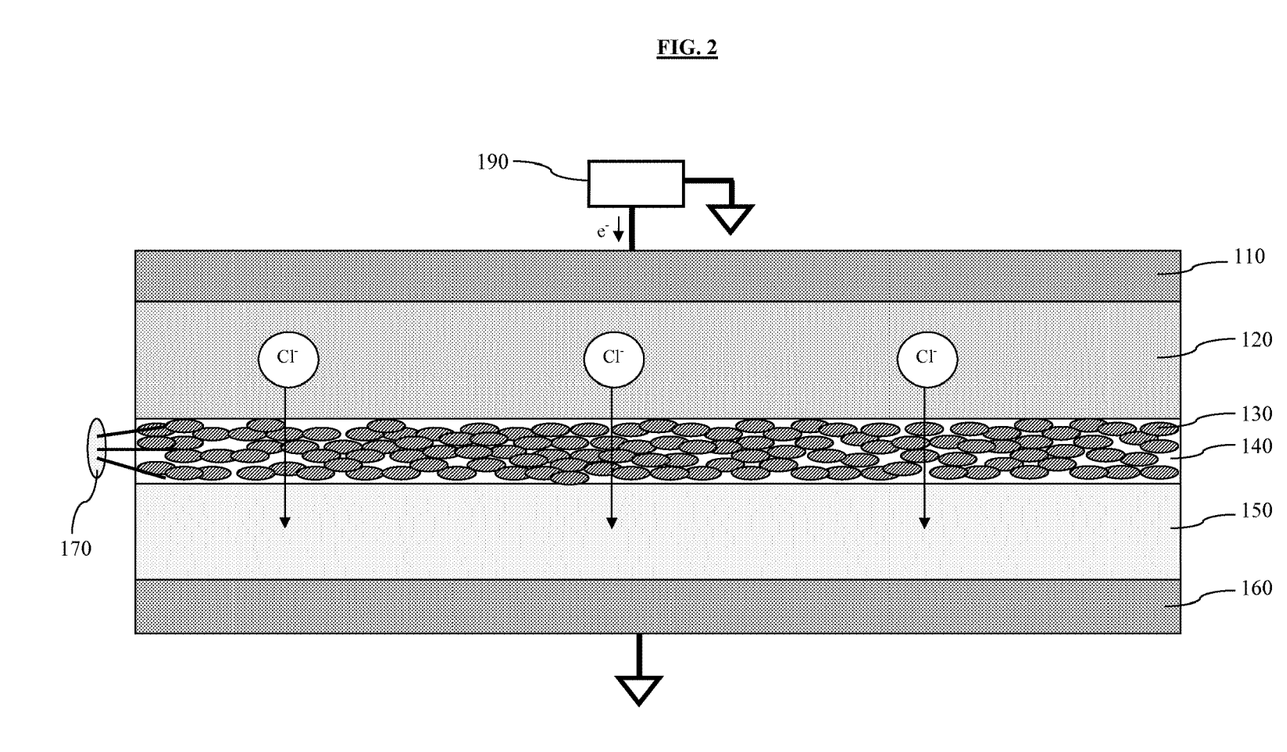
FIG. 2 is a schematic illustrating the movement of anions from saline to freshwater according to an embodiment of the invention.

Light sources 170 and 180 are positioned to illuminate membrane 140; light source 170 with yellow light, and light source 180 with blue light. Light sources 170 and 180 can be any light source capable of generating yellow and blue light, such as LEDs, or sunlight in combination with a filter, for example. In one embodiment, light sources 170 and 180 can be solar powered light sources. Although shown and described with respect to two separate light sources 170 and 180, it is contemplated that a single light source may provide both yellow and blue light. Electrode 110 is connected to load 190, which is powered by the salinization of the freshwater, as described further herein FIG. 2 is a schematic illustrating the movement of anions from saline to freshwater according to an embodiment of the invention. Yellow light 170 is activated, illuminating membrane 140 (and bacteria 130) with yellow light. Yellow light 170 activates halorhodopsins in bacteria 130, permitting the flux of chloride ions from saline 120 into bacteria 130. ClC-2s then flux the chloride ions from bacteria 130 to freshwater 150 along the chloride concentration gradient. Alternatively, halorhodopsin mutants that form light-gated Cl channels rather than light-driven Cl pumps can be used in place of the combination of halorhodopsins and ClC-2s. The net loss of negative charge from saline 120 leads to excess cations and a positive charge in saline 120. In response, electrons from load 190 mobilize chloride ions from electrode 110 into saline 120. Halorhodopsins are activated by yellow light with a peak absorbance at approximately 570 nm. However, the exact wavelength may vary with ionic conditions (e.g., concentrations and types of ions in the saline).

Figure 3:
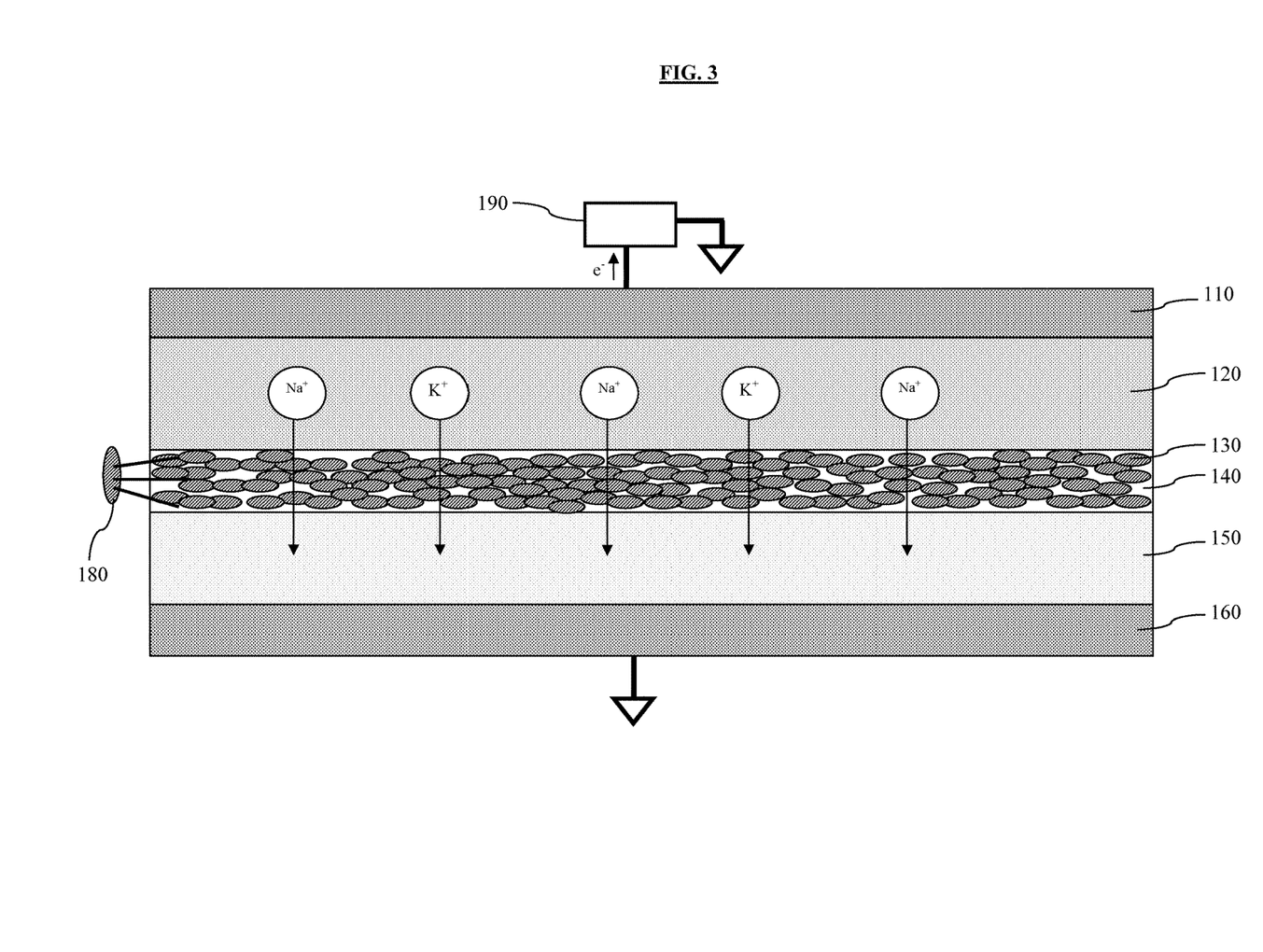
FIG. 3 is a schematic illustrating the movement of cations from saline to freshwater according to an embodiment of the invention.

FIG. 3 is a schematic illustrating the movement of cations from saline to freshwater according to an embodiment of the invention. Blue light 180 is activated, illuminating membrane 140 (and bacteria 130) with blue light. Blue light 180 activates channelrhodopsins in bacteria 130, permitting the flux of cations (e.g., sodium and potassium ions) from saline 120, through membrane 140 and into freshwater 150 along the concentration gradient. This leads to excess anions and a negative charge in saline 120. Net negative charge in saline 120 drives chloride ions back onto electrode 110, and electrons back into load 190. Channelrhodopsins are activated by blue light with a peak absorbance at 480 nm. However, the exact wavelength may again vary with ionic conditions.

Yellow light 170 is then activated again, as described with respect to FIG. 2, then blue light 180, and so on and so forth, thus causing the same bacteria 130 to alternately activate halorhodopsins and channelrhodopsins. Thus, the illumination generates an alternating current whose frequency is set by the rate of alternation of light color between yellow and blue.

In some embodiments, the halorhodopsins can continue to be move ions after yellow light 170 has already been deactivated. For example, it may take a few milliseconds in order for the halorhodopsins to close their pores, stopping the flow of ions. Similarly, the channelrhodopsins can continue to move ions after blue light 180 has already been deactivated, as it may take a few milliseconds after deactivation to close their pores and stop the flow of ions. In these embodiments, the duration and timing of the activation and deactivation of yellow light 170 and blue light 180 can be controlled to optimize the frequency of the alternating current generated.

Embodiments of the invention described herein have a number of advantages over prior approaches. The use of a barrier with switchable permeability between freshwater and saline makes possible AC current generation that reduces membrane polarization and the impedance of the freshwater. Illumination cycles can be timed so that alternating cationic and anionic fluxes minimize local charge build-up and polarization of the membrane, the major limitation of reverse electrodialysis. Frequencies of 50 Hz, for example, are feasible with rhodopsins.

Freshwater impedance is minimized because there is no migration of charge from the membrane through the freshwater to the electrode. Rather there is continual movement of chloride back and forth from the electrode to the interface with freshwater. Experimental studies indicate internal impedance reductions of approximately 1 order of magnitude. The high costs of manufactured semipermeable membranes is overcome using biofilms comprised of rapidly growing bacteria that spontaneously form the biofilm on much less expensive supportive nonselective membrane materials.

Biofouling of the membrane is overcome through the use of a living biofilm with natural defenses against bacterial superinfection that inorganic membranes do not possess. Electrode consumption is overcome by use of alternating current. DC-AC power conversion losses are also prevented by use of alternating current. Although some frequency shifting is likely to be necessary, the small voltages generated by reverse electrodialysis are much easier to step up to useful grid voltages using alternating, instead of direct, current.

Example 1: Expression of Channelrhodopsin

Figure 4A:
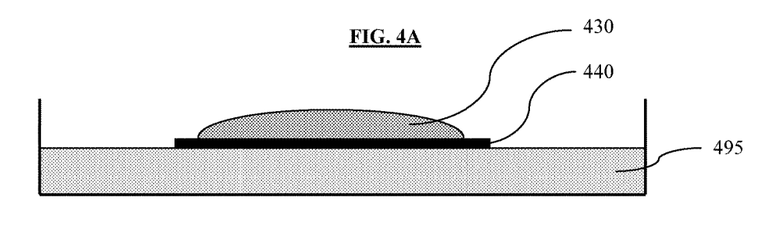
FIG. 4A is a schematic illustrating biofilm growth on a filter membrane according to an embodiment of the invention.

Channelrhodopsin was expressed by transfection with a channelrhodopsin plasmid in the JM109 strain of *E. coli*. The plasmid also encodes for a protein conferring kanamycin-resistance, and a green fluorescent protein. A biofilm was then created by inoculating the *E. coli* on a 25 mm diameter, 8.0 μm pore size, MF-Millipore Mixed Cellulose Ester Membranes filter sitting on LB agar with 50 μg/ml Kanamycin and 5 μM all-trans-retinal added. FIG. 4A is a schematic of biofilm growth on the filter membrane showing agar 495, membrane 440, and bacterial colony 430. The kanamycin selected for bacteria that were actively expressing the plasmid coding for channelrhodopsin.

Figure 4B:
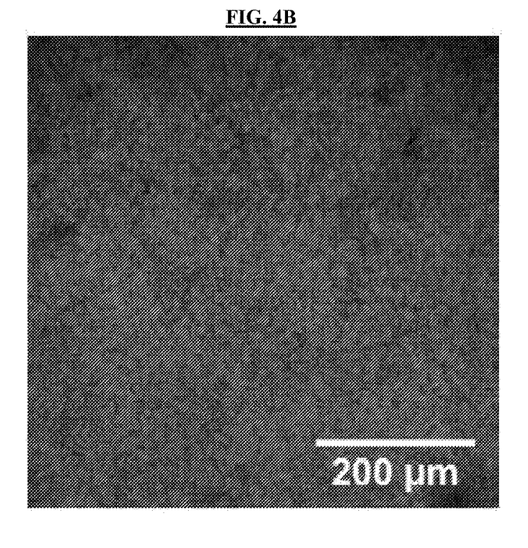
FIG. 4B is a 2-photon image of florescence emitted by GFP co-expressed with channelrhodopsin in *E. coli* that comprise a biofilm according to an embodiment of the invention.

After growth of the biofilm for 3 days, the expression of channelrhodopsin was assayed by the presence of the co-expressed green fluorescent protein (GFP) using fluorescence microscopy. A confluent, 100 μm thick biofilm with strong GFP fluorescence is demonstrated in FIG. 4B, which is a 2-photon image of florescence emitted by GFP co-expressed with channelrhodopsin in the *E. coli* that comprise the biofilm. This demonstrated two key points: that the biofilms are naturally confluent, forming a useful diffusion barrier, and that channelrhodopsin is robustly expressed in *E. coli*. Confluence of bacteria in the biofilm ensures that ion diffusion occurs through the bacteria, which enables the charge separation that generates electricity, rather than around the bacteria, which may not separate charge or generate electricity. Biofilm impedance was measured by applying a frequency-swept sinusoid (chirp signal) across the biofilm and measuring the resulting current. Biofilms with an area of 285 mm$^2$ were measured to have an average impedance of 34Ω, corresponding to a conductivity of 103 μS/mm$^2$.

Figure 4C:
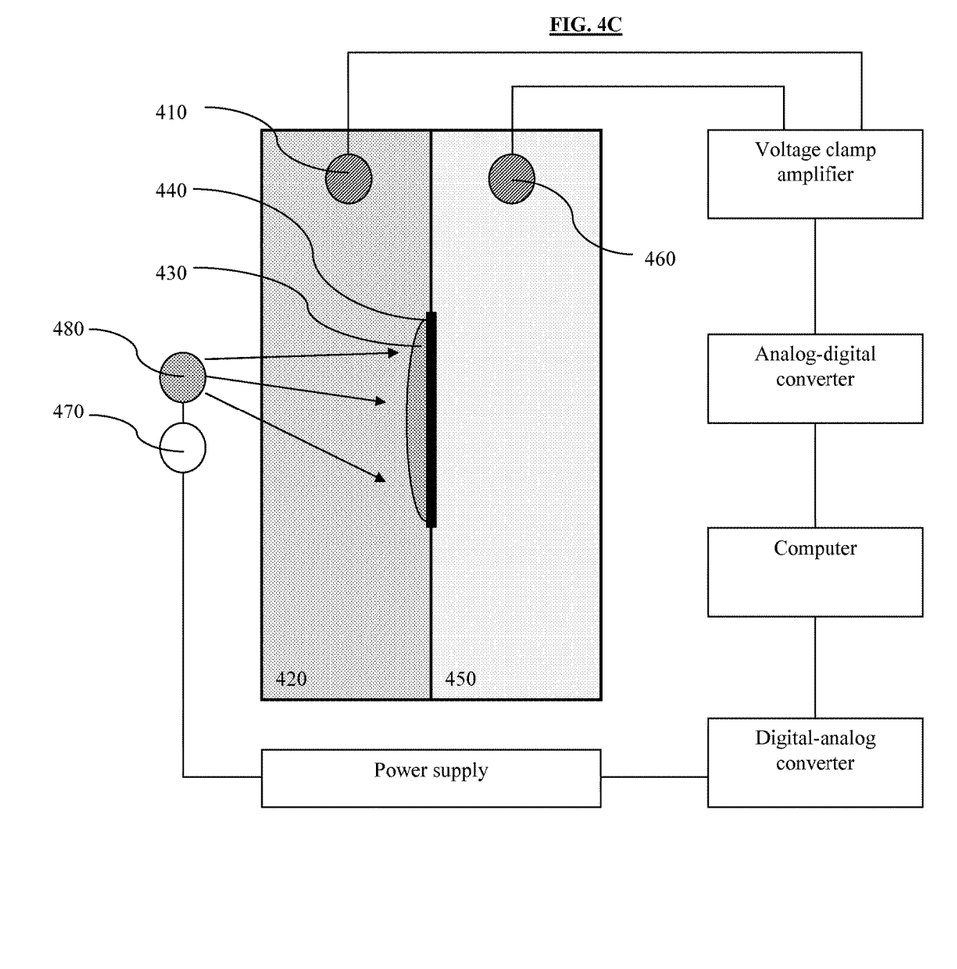
FIG. 4C is the experimental set up for the measurement of light-gated sodium flux from saline to freshwater via channelrhodopsin expressed by *E. coli* in accordance with an embodiment of the invention.

However, the GFP assay does not demonstrate channelrhodopsin directly, nor whether this protein is functional. To test these issues, the membrane filter and biofilm were then transferred to a 2-chamber system, such that the biofilm separated the two chambers. The experimental set up for measuring the currents generated by reverse electrodialysis is illustrated in FIG. 4C. As shown in FIG. 4C, blue light 480 is activated, illuminating membrane 440 (and bacterial colony 430). Yellow light 470 is off. Ag/AgCl$_2$ electrode 410 is immersed in saline 420, while Ag/AgCl$_2$ electrode 460 is immersed in freshwater 450. The volumes of the saline 420 and freshwater 450 reservoirs were 30 ml each.

The experimental saline 420 used was 1M Sodium D-gluconate, and the freshwater 450 was deionized water. Illumination with blue light 480 from an LED resulted in 350 pA current flowing across biofilm 430. Interrupting the light path stopped current flow. Thus, channelrhodopsin opened in response to illumination, and cations flowed through the bacteria 430 from the saline 420 to the freshwater 450 compartment.

Figure 4D:
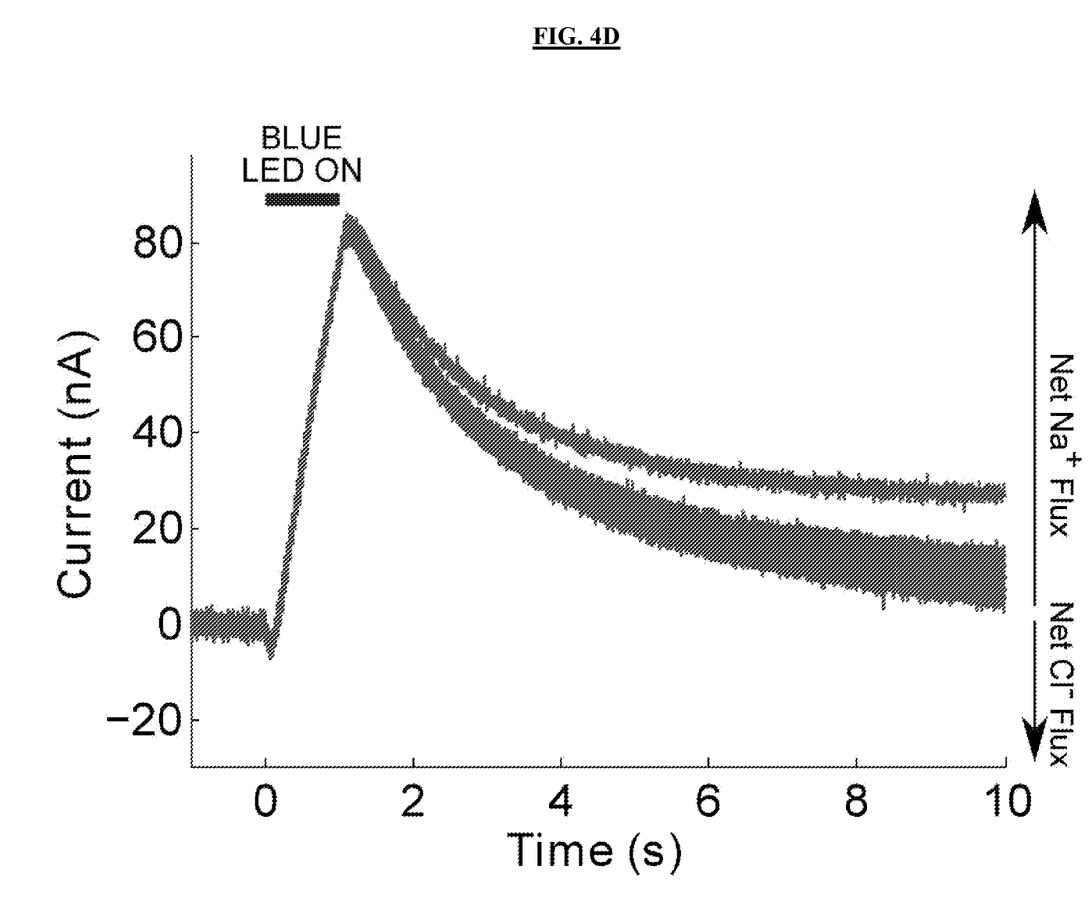
FIG. 4D is a graph illustrating light-gated cation currents flowing between saline and fresh water reservoirs that are separated by an *E. coli* biofilm expressing channel rhodopsin. Experimental set up was as described in FIG. 4C, in accordance with an embodiment of the invention.

The mean AC conductivity of the un-illuminated membrane and biofilm was 103 μS/mm$^2$. Illumination of the membrane at 5 mW/mm$^2$ triggered the current shown in FIG. 4D. The current was clearly triggered by light. Light intensity was not a limiting factor, and covering the light blocked the current, eliminating any artifactual causes for the measured light-gated currents. Light-gated currents were stable for at least one hour at 0.1 hertz.

Embodiments of various aspects described herein can be defined in any of the following numbered paragraphs:

1. A system for generating electricity from the salinization of freshwater, the system comprising:
   a first electrode in saline;
   a second electrode in freshwater;
   a membrane separating the saline and the freshwater, the membrane comprising a biofilm; and
   a light source configured to illuminate the biofilm with alternating yellow and blue light,
   wherein the biofilm includes bacteria capable of expressing rhodopsins.
2. A system according to paragraph 1 wherein at least some of the bacteria are modified to suppress endogenous cationic conductances.
3. A system according to paragraph 1 wherein at least some of the bacteria are modified to suppress endogenous anionic conductances.
4. A system according to paragraph 1 wherein at least some of the bacteria are modified to suppress endogenous cationic and anionic conductances through the membrane.
5. A method of generating electricity from the salinization of freshwater, the system comprising:
   separating saline and freshwater with a membrane, the membrane comprising a biofilm;
   providing a first electrode in the saline and a second electrode in the freshwater; and
   alternately illuminating the biofilm with yellow and blue light,
   wherein the biofilm includes bacteria capable of expressing rhodopsins.

6. A method of generating electricity according to paragraph 5 further comprising suppressing endogenous cationic conductances through the membrane.

7. A method of generating electricity according to paragraph 5 further comprising suppressing endogenous anionic conductances through the membrane.

8. A method of generating electricity according to paragraph 5 further comprising suppressing endogenous cationic and anionic conductances through the membrane.

The present invention has been described in relation to particular examples, which are intended in all respects to be illustrative rather than restrictive. Those skilled in the art will appreciate that many different combinations of materials and components will be suitable for practicing the present invention.

Other implementations of the invention will be apparent to those skilled in the art from consideration of the specification and practice of the invention disclosed herein. For example, light-gated ionic currents can be amplified by inclusion of voltage-gated ion channels in the bacterial membrane, as is described herein for ClC-2, or other bacteria could be used to express the necessary ion channels. Various aspects and/or components of the described embodiments may be used singly or in any combination. It is intended that the specification and examples be considered as exemplary only, with a true scope and spirit of the invention being indicated by the following claims.

What is claimed is:

1. A system for generating electricity from the salinization of freshwater, the system comprising:
   a first electrode in saline;
   a second electrode in freshwater;
   a biofilm forming a membrane separating the saline and the freshwater; and
   a light source configured to illuminate the biofilm with alternating yellow and blue light,
   wherein the biofilm includes bacteria configured to express rhodopsins in a membrane of the bacteria whereby ions diffuse primarily through the bacteria from the saline to the fresh water in response to exposure to the alternating yellow and blue light.

2. The system of claim 1, wherein the expressed rhodopsins include channelrhodopsins and halorhodopsins.

3. The system of claim 2, wherein the bacteria are further capable of expressing ClC-2.

4. The system of claim 1, wherein the expressed rhodopsins include channelrhodopsins and halorhodopsin mutants forming a light-gated Cl channel.

5. The system of claim 1, wherein the biofilm includes *E. coli* bacteria.

6. The system of claim 1, wherein the biofilm includes archaebacteria.

7. The system of claim 1, wherein the saline includes seawater.

8. The system of claim 1, wherein the freshwater includes at least one of river water and wastewater.

9. The system of claim 1, wherein the light source includes at least one light emitting diode (LED).

10. The system of claim 1, wherein the first electrode and the second electrode include Ag/AgCl or Ru/Ir.

11. The system of claim 1, further comprising a load attached to the first electrode.

12. A method of generating electricity from the salinization of freshwater, the method comprising:
    separating saline and freshwater with a membrane, the membrane comprising a biofilm;
    providing a first electrode in the saline and a second electrode in the freshwater; and
    alternately illuminating the biofilm with yellow and blue light,
    wherein the biofilm includes bacteria configured to express rhodopsins in a membrane of the bacteria whereby ions diffuse primarily through the bacteria from the saline to the fresh water in response to exposure to the alternating yellow and blue light.

13. The method of claim 12, wherein the expressed rhodopsins include channelrhodopsins and halorhodopsins.

14. The method of claim 13, wherein the bacteria are further capable of expressing ClC-2.

15. The method of claim 12, wherein the expressed rhodopins include channelrhodopsins and halorhodopsin mutants forming a light-gated Cl channel.

16. The method of claim 12, wherein the biofilm includes *E. coli* bacteria.

17. The method of claim 12, wherein the biofilm includes archaebacteria.

18. The method of claim 12, wherein the saline includes seawater.

19. The method of claim 12, wherein the freshwater includes at least one of river water and wastewater.

20. The method of claim 12, wherein the biofilm is alternately illuminated by at least one light emitting diode (LED).

21. The method of claim 12, wherein the first electrode and the second electrode include Ag/AgCl or Ru/Ir.

22. The method of claim 12, further comprising attaching a load to the first electrode.

* * * * *